(12) United States Patent
Talty

(10) Patent No.: US 7,382,188 B2
(45) Date of Patent: Jun. 3, 2008

(54) CIRCUIT FOR REDUCING DISTORTION OF CLASS D AMPLIFIER

(75) Inventor: Robert Talty, Hsin-Chu Hsien (TW)

(73) Assignee: MStar Semiconductor, Inc., Hsin-Chu Hsien (TW)

( * ) Notice: Subject to any disclaimer, the term of this patent is extended or adjusted under 35 U.S.C. 154(b) by 44 days.

(21) Appl. No.: 11/608,848

(22) Filed: Dec. 11, 2006

(65) Prior Publication Data

US 2007/0290750 A1 Dec. 20, 2007

Related U.S. Application Data

(60) Provisional application No. 60/804,938, filed on Jun. 16, 2006.

(51) Int. Cl.
*H03F 3/217* (2006.01)
(52) U.S. Cl. ......................... 330/251; 330/10
(58) Field of Classification Search ................. 330/10, 330/207 A, 251
See application file for complete search history.

(56) References Cited

U.S. PATENT DOCUMENTS

| 6,211,728 | B1 | 4/2001 | Chen et al. | |
| 6,509,793 | B2 * | 1/2003 | Kim | 330/10 |
| 6,967,527 | B2 * | 11/2005 | Fukushima | 330/10 |
| 7,142,049 | B2 * | 11/2006 | Kirn | 330/10 |
| 7,157,968 | B2 * | 1/2007 | Shin | 330/251 |
| 7,196,575 | B2 * | 3/2007 | Kim | 330/10 |

* cited by examiner

*Primary Examiner*—Henry K Choe
(74) *Attorney, Agent, or Firm*—Winston Hsu

(57) ABSTRACT

A class-D switching amplifier is disclosed. The class-D switching amplifier includes two control circuits, a load, and six switching devices. The load is coupled to the six switching devices. The first and the second control circuits provide a first and a second PWM pulse respectively. Each of the first and second switching devices has a first terminal coupled to a first voltage level, a second terminal coupled to the load, and a control terminal coupled to the first control circuit. Each of the third, fourth, fifth, and sixth switching devices has a first terminal coupled to a second voltage level, and a second terminal coupled to the load. The control terminals of the third and fourth switching devices are coupled to the first control circuit. The control terminals of the fifth and sixth switching devices are coupled to the second control circuit.

6 Claims, 2 Drawing Sheets

US 7,382,188 B2

CIRCUIT FOR REDUCING DISTORTION OF CLASS D AMPLIFIER

CROSS REFERENCE TO RELATED APPLICATIONS

This application claims the benefit of U.S. Provisional Application No. 60/804,938, filed Jun. 16, 2006, the subject matter of which is incorporated herein by reference.

BACKGROUND OF INVENTION

1. Field of the Invention

The present invention relates to class D amplifiers, especially to a circuit for modulating the circulating current to reduce the distortion of a Class D amplifier.

2. Description of the Prior Art

With Class D amplifiers the "carrier" frequency (period of the PWM ramp generator) is typically in the range of 200 kHz to 2 MHz. At full output power the signal is high all the time; at 50% power, the signal is high 50% of the time and decreases linearly with the desired audio level. Since the output power is proportional to the output pulse width, it follows that signal distortion is proportional to the error in the effective pulse width compared to the desired pulse width. At large signal levels, this error is small; however, for small input signals the error is large. For typical CMOS processes that are utilized for Class D amplifiers, the smallest pulse that can be output is about 50±10 nsec. Since the human ear has a very wide dynamic range, to hear undistorted output signals requires a total error to signal ratio (called THD+N total harmonic distortion plus noise) of about −60 dB. To achieve this with a PWM system, the linear ratio of minimum pulse width to maximum pulse width needs to be 1000:1, e.g. for a 2 usec period the smallest pulse needs to be 2 nsec. Obviously, this is not possible in a process that has a 50 nsec minimum pulse width. For typical Class D amplifiers the uncorrected large signal distortion will be around −35 dB to −45 dB, but the percentage distortion climbs rapidly with decreasing signal level. There are a number of techniques which seek to linearize the output stage so that distortion is reduced and small signal performance is improved. The three main error correction techniques are:

(a) Feedback from the Class D output to an input integrator;

(b) Dummy correction pulses (i.e. for a 1 nsec pulse we output positive 51 nsec pulse and a negative 50 nsec pulse);

(c) Sigma-Delta noise shaping plus feedback.

To "noise shape" the output so that wider pulses are used, the signal error components are shifted by the noise shaping function to be above the audible frequency band. Noise shaping the signal typically improves the linear range by about 20 dB over that which is achieved with simple PWM. This results in large signal distortion components at −50 dB to −60 dB.

For state 3 and state 4 PWM systems disclosed in U.S. Pat. No. 6,211,728, the ON pulse width is proportional to signal strength and during the OFF period the current induced in the filter inductors by the ON pulse is circulated either through the NMOS or PMOS devices in the H-bridge. These are known respectively as LOW side circulation and HIGH side circulation.

SUMMARY OF INVENTION

It is therefore a primary objective of the claimed invention to provide a class-D amplifier.

According to an embodiment of the claimed invention, a class-D switching amplifier is disclosed. The class-D switching amplifier includes two control circuits, a load, and six switching devices. The first control circuit provides a first PWM pulse to the first, second, third, and fourth switching devices. The first switching device has a first terminal coupled to a first voltage level, a second terminal coupled to the load, and a control terminal coupled to the first control circuit. The second switching device has a first terminal coupled to the first voltage level, a second terminal coupled to the load, and a control terminal coupled to the first control circuit. The third switching device has a first terminal coupled to a second voltage level, a second terminal coupled to the load, and a control terminal coupled to the first control circuit. The fourth switching device has a first terminal coupled to the second voltage level, a second terminal coupled to the load, and a control terminal coupled to the first control circuit. The second control circuit provides a second PWN pulse for the fifth and the sixth switching devices. The fifth switching device has a first terminal coupled to a reference voltage level, a second terminal coupled to the load, and a control terminal coupled to the second control circuit. The sixth switching device has a first terminal coupled to the reference voltage level, a second terminal coupled to the load, and a control terminal coupled to the second control circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The error correction technique discussed below can be realized for either HIGH side or LOW side recirculation. However, for simplicity, further discussion is restricted to the LOW side implementation.

Figure 1:
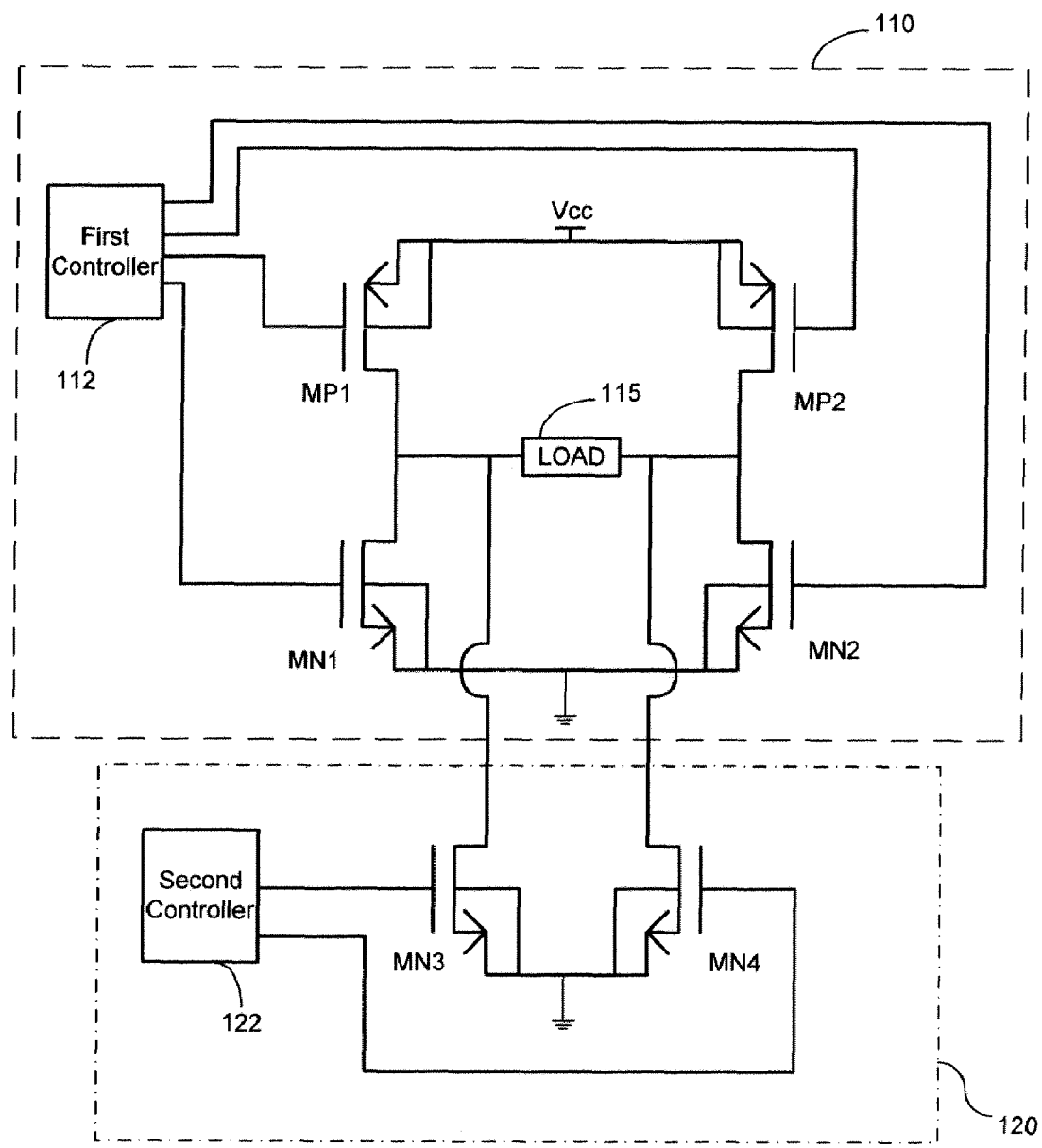
FIG. 1 shows a Class D amplifier according to a first embodiment of the present invention.

Please refer to FIG. 1. FIG. 1 shows a Class D amplifier 110 coupled to a modulation circuit 120. The first controller 112 provides a first PWM pulse to the four switching devices, which are implemented by MOSFET's MP1, MP2, MN1, and MN2, to control the on and off states of these four switching devices. As shown in the figure, MP1 and MP2 have their source terminals coupled to a voltage level (Vcc), their drain terminals coupled to the load 115, and their gate terminals coupled to the first controller 112. Similarly, MN1 and MN2 have their source terminals coupled to a voltage level (e.g., the ground level), their drain terminals coupled to the load 115, and their gate terminals coupled to the first controller 112. A current flow is introduced in the load 115, which is usually an inductor, and is circulated during an OFF period of the Class D amplifier. This current can further be modulated during the OFF period by changing the effective size of the N-MOSFET based modulation circuit 120. The modulation circuit 120 includes a second controller 122 and two switching devices, which are implemented by N-MOSFET's MN3 and MN4. Both source terminals of MN3 and MN4 are coupled to a voltage level, e.g., the ground level; the drain terminals are coupled to the load 115; the gate terminals are controlled by the second controller 122. Due to the overall effect of this form of modulation, the modulation circuit is useful for producing signals in the signal rage of −30 dB to −70 dB. However, this range corresponds to the typical first order error components of a simple PWM system. So a second PWM pulse provided by the second controller 122 can be utilized to directly correct errors in the first PWM pulse and to thus reduce the total forward channel errors.

Typically, a negative feedback is usually utilized to further reduce distortion of a Class D amplifier. Unfortunately, when being combined with a high gain noise shaping modulator and large output errors, the negative feedback usually results in an oscillation of the modulator for small input signals. This oscillation often mixes with the carrier frequency to create spurs or tones. Tones are easily heard and are therefore undesirable in audio amplifiers especially when tones occur due to small or even zero input signals (i.e. when no other masking signal is present). However, if the total forward channel error can be reduced, the feedback error will be small in relation to the input signal which reduces the tendency of the feedback loop to oscillate. The tendency of the feedback loop to oscillate is often blamed for the tinny sound that most Class D amplifiers possess especially when the input signal is at a low level with a high level transient (e.g. gun shot in a movie or cymbals in music).

Figure 2:
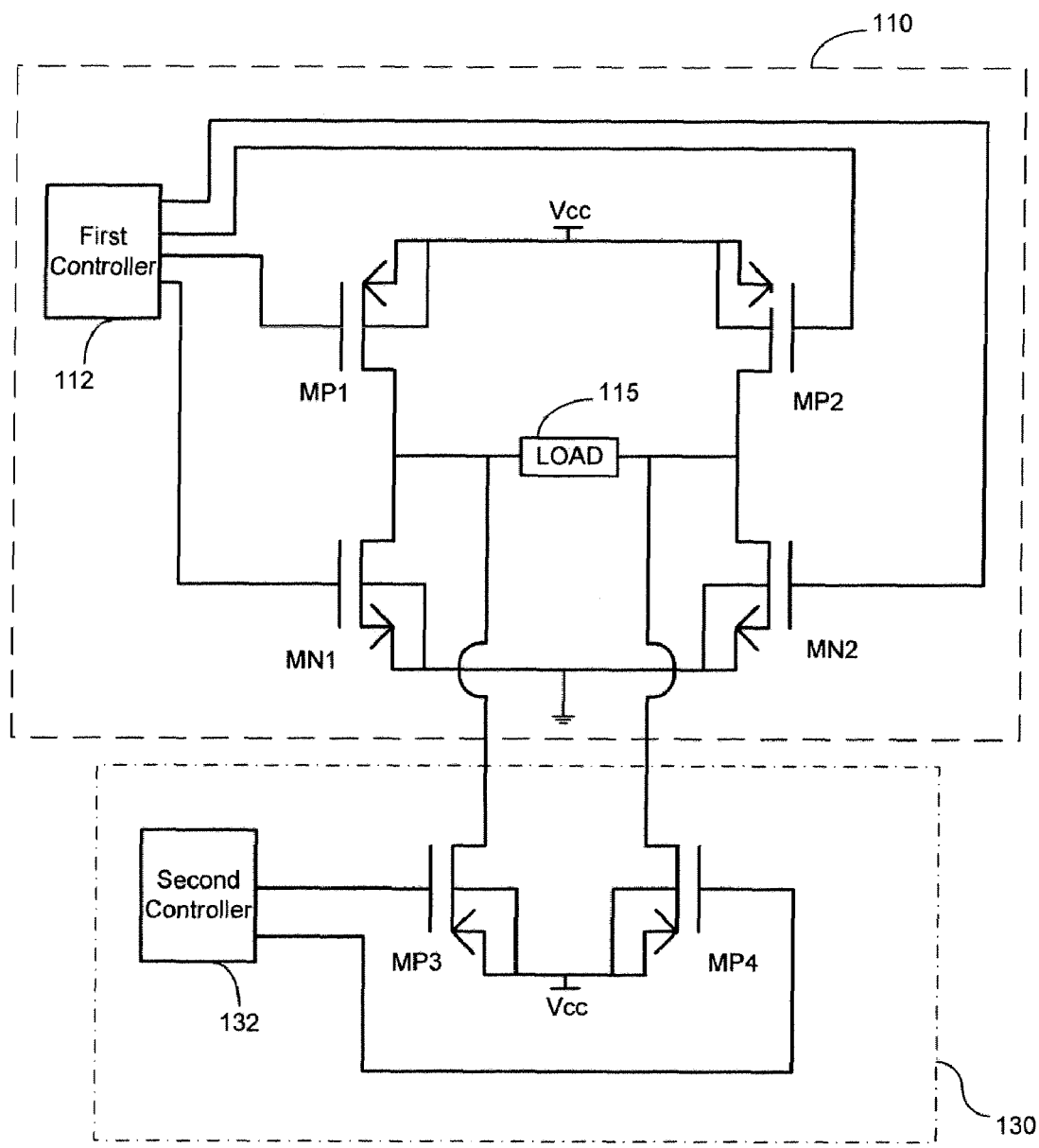
FIG. 2 shows a Class D amplifier according to a second embodiment of the present invention.

The modulation circuit 120 shown in FIG. 1 can also be implemented by P-MOSFET's. Please refer to FIG. 2. FIG. 2 shows a Class D amplifier 110 coupled to a modulation circuit 130. The modulation circuit 130 includes a second controller 132 and two P-MOSFET's MP3 and MP4. Both source terminals of MP3 and MP4 are coupled to a voltage level (Vcc); the drain terminals are coupled to the load 115; the gate terminals are controlled by the second controller 132.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A class-D switching amplifier, comprising:
   a first control circuit for providing a first PWM pulse;
   a load;
   a first switching device having a first terminal coupled to a first voltage level, a second terminal coupled to the load, and a control terminal coupled to the first control circuit;
   a second switching device having a first terminal coupled to the first voltage level, a second terminal coupled to the load, and a control terminal coupled to the first control circuit;
   a third switching device having a first terminal coupled to a second voltage level, a second terminal coupled to the load, and a control terminal coupled to the first control circuit;
   a fourth switching device having a first terminal coupled to the second voltage level, a second terminal coupled to the load, and a control terminal coupled to the first control circuit;
   a second control circuit for providing a second PWM pulse;
   a fifth switching device having a first terminal coupled to a reference voltage level, a second terminal coupled to the load, and a control terminal coupled to the second control circuit; and
   a sixth switching device having a first terminal coupled to the reference voltage level, a second terminal coupled to the load, and a control terminal coupled to the second control circuit.

2. The class-D switching amplifier of claim 1, wherein the first and the second switching devices are P-MOSFET, with the source terminals coupled to the first voltage level, the drain terminals coupled to the load, and the gate terminals coupled to the first control circuit.

3. The class-D switching amplifier of claim 1, wherein the third, and the fourth switching devices are N-MOSFET, with the source terminals coupled to the second voltage level, the drain terminals coupled to the load, and the gate terminals coupled to the first control circuit.

4. The class-D switching amplifier of claim 1, wherein the reference voltage level is the second voltage level, and the fifth, and the sixth switching devices are N-MOSFET, with the source terminals coupled to the second voltage level, the drain terminals coupled to the load, and the gate terminals coupled to the second control circuit.

5. The class-D switching amplifier of claim 1, wherein the load is an inductor.

6. The class-D switching amplifier of claim 1, wherein the reference voltage level is the first voltage level, and the fifth, and the sixth switching devices are P-MOSFET, with the source terminals coupled to the first voltage level, the drain terminals coupled to the load, and the gate terminals coupled to the second control circuit.

* * * * *